US012764997B2

(12) United States Patent
Nagahisa et al.

(10) Patent No.: US 12,764,997 B2
(45) Date of Patent: Oct. 13, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Yuichi Nagahisa, Tokyo (JP); Kohei Adachi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 259 days.

(21) Appl. No.: 18/655,207

(22) Filed: May 3, 2024

(65) Prior Publication Data

US 2025/0056836 A1 Feb. 13, 2025

(30) Foreign Application Priority Data

Aug. 9, 2023 (JP) ................................ 2023-130058

(51) Int. Cl.
*H10D 30/66* (2025.01)
*H10D 12/01* (2025.01)
(Continued)

(52) U.S. Cl.
CPC ......... *H10D 30/668* (2025.01); *H10D 12/031* (2025.01); *H10D 30/0297* (2025.01); *H10D 62/106* (2025.01); *H10D 62/393* (2025.01); *H10D 62/8325* (2025.01); *H10P 30/2042* (2026.01); *H10P 30/222* (2026.01)

(58) Field of Classification Search
CPC ............... H10D 30/668; H10D 12/031; H10D 30/0297; H10D 62/106; H10D 62/393; H10D 62/8325; H10P 30/2042; H10P 30/222; H10P 30/21
See application file for complete search history.

(56) References Cited

U.S. PATENT DOCUMENTS

2007/0007537 A1* 1/2007 Ogura .................... H10D 30/66 257/E29.054
2009/0261350 A1 10/2009 Yamamoto et al.
(Continued)

FOREIGN PATENT DOCUMENTS

JP 2009-259896 A 11/2009
JP 2009-260064 A 11/2009
(Continued)

OTHER PUBLICATIONS

"Notice of Reasons for Refusal" Office Action issued in JP 2023-130058; mailed by the Japanese Patent Office on Aug. 4, 2026.

*Primary Examiner* — Victor A Mandala
(74) *Attorney, Agent, or Firm* — Studebaker Brackett PLLC

(57) ABSTRACT

A semiconductor device includes: a body region disposed between a drift layer and each of a source region and a contact region, having a lower second conductivity type impurity concentration than the contact region, and having a second conductivity type; and a channel layer disposed on a portion of an inner surface of a trench corresponding at least to the contact region and having fewer crystal defects than the contact region, the trench extending through the source region, the contact region, and the body region to the drift layer.

9 Claims, 7 Drawing Sheets

(51) Int. Cl.

| | |
|---|---|
| ***H10D 30/01*** | (2025.01) |
| ***H10D 62/10*** | (2025.01) |
| ***H10D 62/17*** | (2025.01) |
| ***H10D 62/832*** | (2025.01) |
| ***H10P 30/20*** | (2026.01) |

(56) References Cited

U.S. PATENT DOCUMENTS

| | | | | |
|---|---|---|---|---|
| 2009/0280609 | A1 | 11/2009 | Akiba et al. | |
| 2014/0110723 | A1 | 4/2014 | Ikegami et al. | |
| 2017/0110571 | A1 | 4/2017 | Kobayashi et al. | |
| 2018/0175149 | A1* | 6/2018 | Takaya | H10D 12/481 |
| 2018/0182883 | A1* | 6/2018 | Yamada | H10D 30/66 |
| 2018/0366569 | A1* | 12/2018 | Zeng | H10D 30/473 |
| 2020/0161467 | A1 | 5/2020 | Takeuchi et al. | |
| 2021/0083100 | A1* | 3/2021 | Tanaka | H10D 30/668 |

FOREIGN PATENT DOCUMENTS

| | | | |
|---|---|---|---|
| JP | 2017-079251 | A | 4/2017 |
| JP | 2019-016775 | A | 1/2019 |
| WO | 2012/164817 | A1 | 12/2012 |

* cited by examiner

FIG. 6 <A-A'>

SEMICONDUCTOR DEVICE AND METHOD OF MANUFACTURING SEMICONDUCTOR DEVICE

BACKGROUND OF THE INVENTION

Field of the Invention

The present disclosure relates to semiconductor devices and methods of manufacturing the semiconductor devices.

Description of the Background Art

A semiconductor device in which a channel layer is formed on an inner surface of a trench in a source region by epitaxial growth has been proposed (e.g., Japanese Patent Application Laid-Open No. 2009-259896).

In a configuration disclosed in Japanese Patent Application Laid-Open No. 2009-259896, the source region is disposed between a gate insulating film and a contact region, and the gate insulating film and the contact region are not in contact with each other. In a configuration in which the contact region is in the form of stripes in plan view, however, the gate insulating film and the contact region are in contact with each other.

The contact region is generally formed by ion implantation of a high concentration of impurities and thus has many crystal defects. Thus, in a configuration in which the gate insulating film and the contact region are in contact with each other, an electric field of a gate voltage might locally be concentrated on an interface between a crystal defect portion of the contact region and the gate insulating film, or the gate insulating film might have a defect attributable to the crystal defect portion of the contact region. This results in a problem of a leakage current generated in a semiconductor device to reduce reliability of the semiconductor device.

SUMMARY

The present disclosure has been conceived in view of a problem as described above, and it is an object of the present disclosure to provide technology capable of increasing reliability of a semiconductor device.

A semiconductor device according to the present disclosure includes: a drift layer having a first conductivity type; a source region selectively disposed above the drift layer and having the first conductivity type; a contact region selectively disposed above the drift layer and having a second conductivity type; a body region disposed between the drift layer and each of the source region and the contact region, having a lower second conductivity type impurity concentration than the contact region, and having the second conductivity type; a channel layer disposed on a portion of an inner surface of a trench corresponding at least to the contact region and having fewer crystal defects than the contact region, the trench extending through the source region, the contact region, and the body region to the drift layer; a gate insulating film disposed along the inner surface of the trench; and a gate electrode disposed on the gate insulating film in the trench.

Reliability of the semiconductor device can be increased.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described below with reference to the accompanying drawings. Features described in the embodiments below are examples, and all the features are not necessarily required. In description made below, similar components in the embodiments bear the same or similar reference signs, and different components will mainly be described. In description made below, specific positions and directions, such as "upper", "lower", "left", "right", "front", and "back", may not necessarily match positions and directions in actual implementation. A higher concentration in a portion than in another portion means that an average concentration in the portion is higher than an average concentration in the other portion, for example. In contrast, a lower concentration in a portion than in another portion means that an average concentration in the portion is lower than an average concentration in the other portion, for example. While description will be made below based on the assumption that a first conductivity type is an n type and a second conductivity type is a p type, the first conductivity type may be the p type and the second conductivity type may be the n type.

Embodiment 1

Figure 1:
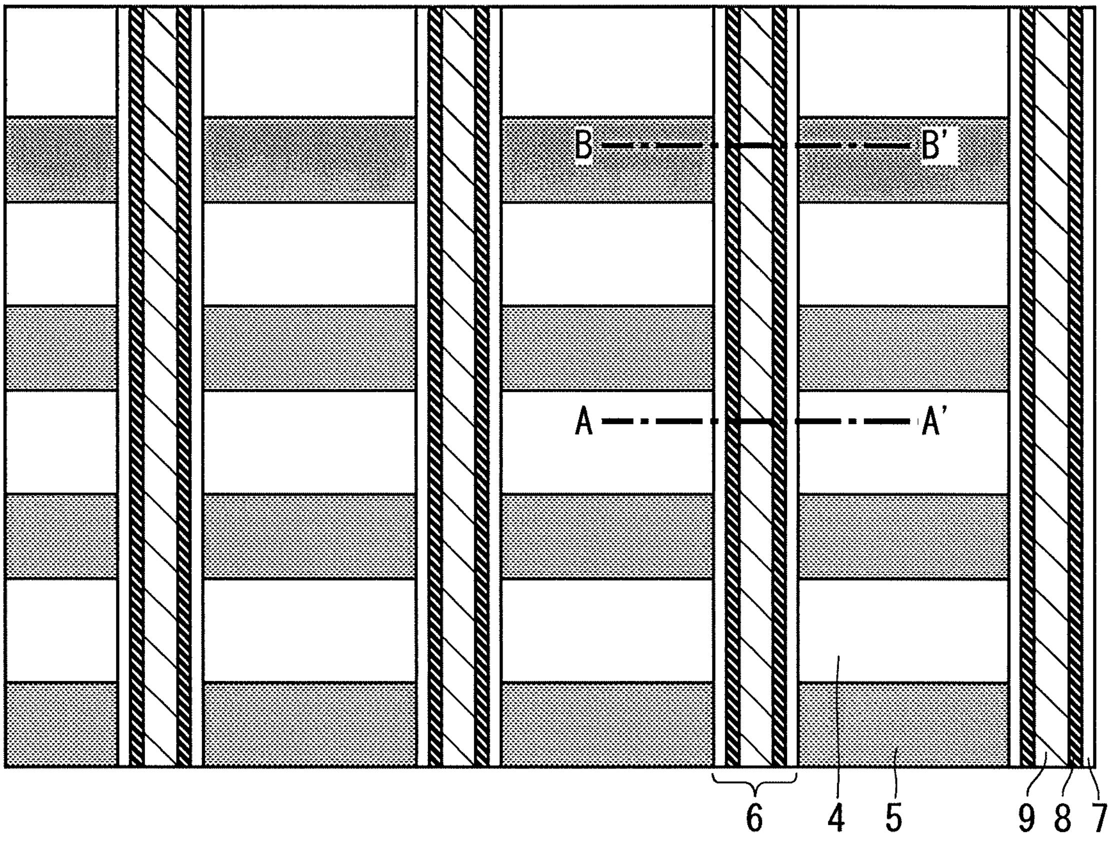
FIG. 1 is a plan view illustrating a configuration of a semiconductor device according to Embodiment 1.
Figure 2:
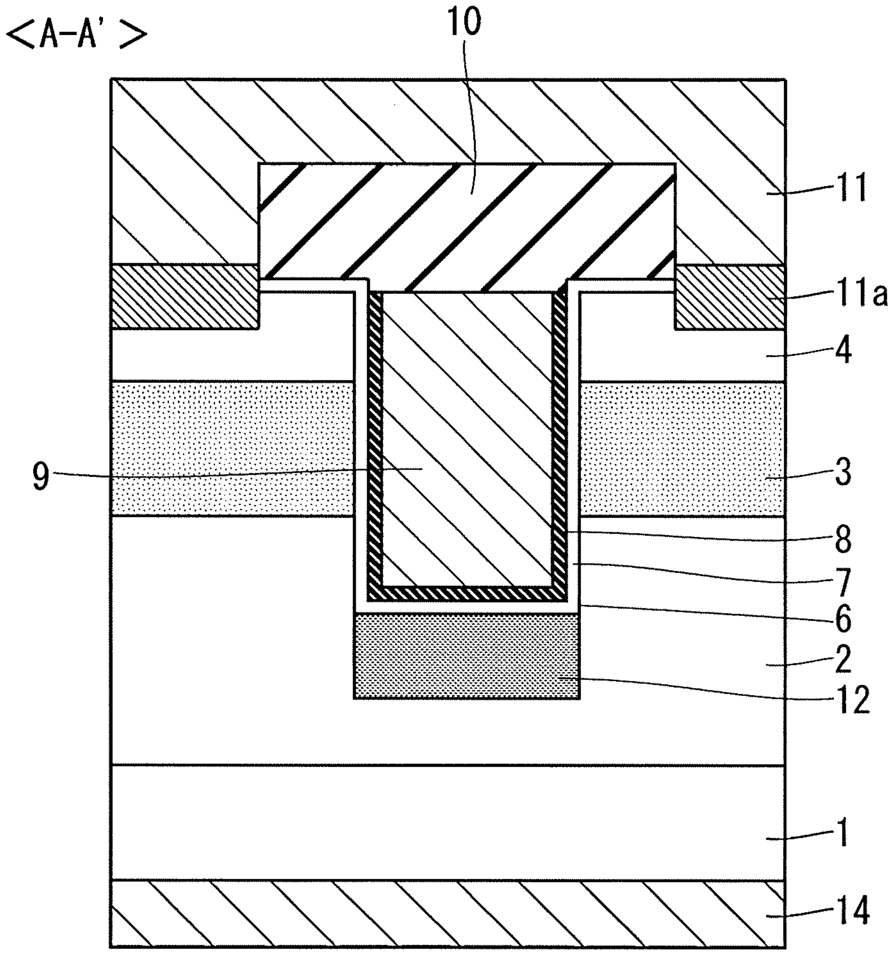
FIG. 2 is a cross-sectional view illustrating the configuration of the semiconductor device according to Embodiment 1.
Figure 3:
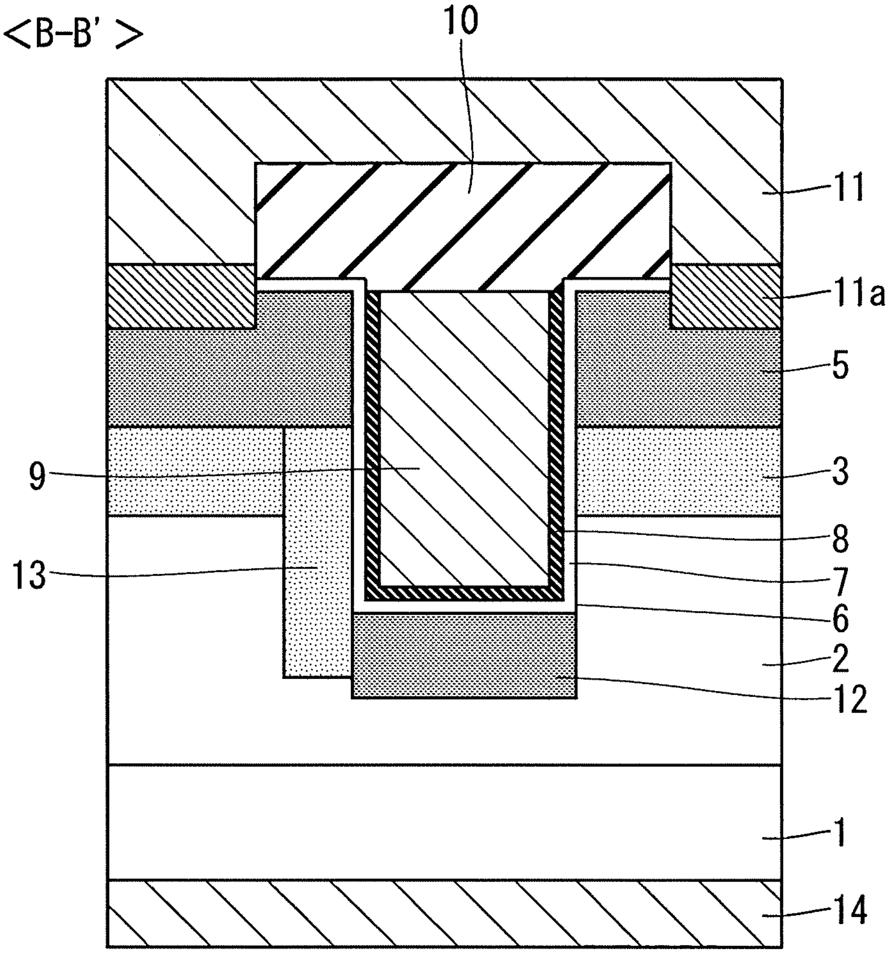
FIG. 3 is a cross-sectional view illustrating the configuration of the semiconductor device according to Embodiment 1.

FIG. 1 is a plan view illustrating a configuration of a semiconductor device according to Embodiment 1, FIG. 2 is a cross-sectional view taken along the line A-A' of FIG. 1, and FIG. 3 is a cross-sectional view taken along the line B-B' of FIG. 1. The semiconductor device according to Embodiment 1 is a metal oxide semiconductor field effect transistor (MOSFET) but is not limited to the MOSFET as described below.

As illustrated in FIGS. 2 and 3, the semiconductor device according to Embodiment 1 includes an n-type semiconductor substrate 1, an n-type drift layer 2, a p-type body region 3, an n-type source region 4 (see FIG. 2), a p-type contact region 5 (see FIG. 3), a channel layer 7, a gate insulating film 8, a gate electrode 9, an interlayer insulating film 10, a source electrode 11, a p-type bottom protective region 12, a p-type connection region 13 (see FIG. 3), and a drain electrode 14.

In an example of FIGS. 2 and 3, the drift layer 2 is an epitaxial layer disposed on an upper surface of the semiconductor substrate 1, for example. The drift layer 2 is not limited to this layer and may be the semiconductor substrate 1 or may be the semiconductor substrate 1 and the epitaxial layer. The semiconductor substrate 1, the drift layer 2, the body region 3, the source region 4, and the contact region 5 each contain silicon carbide in Embodiment 1 but may each contain silicon or may each contain a wide-bandgap semiconductor other than silicon carbide (e.g., GaN and diamond).

As illustrated in FIGS. 2 and 3, the source region 4 and the p-type contact region 5 having a high concentration are each selectively disposed above the drift layer 2. As illustrated in FIG. 1, the source region 4 and the contact region 5 are in the form of stripes in plan view.

As illustrated in FIGS. 2 and 3, the body region 3 is disposed between the drift layer 2 and each of the source region 4 and the contact region 5. The body region 3 is disposed at a position deeper than each of the source region 4 and the contact region 5 and shallower than a bottom of a trench 6, which will be described below. The body region 3 has a lower p-type impurity concentration than the contact region 5.

The trench 6 extending through the source region 4, the contact region 5, and the body region 3 to the drift layer 2 is provided in the source region 4, the contact region 5, and the body region 3. As illustrated in FIG. 1, the trench 6 extends in a direction crossing a direction of extension of each of the source region 4 and the contact region 5 in plan view.

As illustrated in FIGS. 2 and 3, the channel layer 7 is disposed on a portion of an inner surface of the trench 6 corresponding at least to the contact region 5. In Embodiment 1, the channel layer 7 is formed to cover the entire inner surface including a side surface and a bottom surface of the trench 6 and a portion of upper surfaces of the source region 4 and the contact region 5. The channel layer 7 has a thickness in the direction of extension of the contact region 5, that is, a thickness between the contact region 5 and the gate insulating film 8 of 500 nm or less, for example.

The channel layer 7 has fewer crystal defects than the contact region 5. The channel layer 7 as described above can be formed, after ion implementation to form the contact region 5, by epitaxial growth with fewer crystal defects, for example.

The channel layer 7 may have the n-type or the p-type or may not have a conductivity type. The channel layer 7 having the n-type or the p-type may be formed by epitaxial growth using n-type or p-type impurities. The channel layer 7 having the n-type or the p-type may be formed, after formation of an epitaxial layer by epitaxial growth, by ion implantation with fewer crystal defects into the epitaxial layer than ion implantation into the contact region 5, as described in Embodiment 2. The crystal defects can be measured using X-rays, cathodoluminescence light, and secondary electrons, for example.

The gate insulating film 8 is an oxide film, for example, and is disposed along the inner surface of the trench 6. The gate insulating film 8 is disposed on the channel layer 7 in the example of FIGS. 2 and 3 but may be disposed on the channel layer 7 and a portion of the inner surface of the trench 6 on which the channel layer 7 is not disposed.

The gate electrode 9 is a conductive member, such as polysilicon, and is disposed on the gate insulating film 8 in the trench 6. The interlayer insulating film 10 covers the gate electrode 9 to the extent that the gate electrode 9 can electrically be connected to an outside to insulate the gate electrode 9 from each of the channel layer 7 and the source electrode 11. The source electrode 11 is electrically connected to the source region 4 and the contact region 5. The source electrode 11 may include a silicide film 11*a* to be in ohmic contact with the source region 4 and the contact region 5, for example.

The bottom protective region 12 is disposed at the bottom of the trench 6. For example, the bottom protective region 12 has a higher p-type impurity concentration than the body region 3. The connection region 13 electrically connects the body region 3 and the bottom protective region 12. The drain electrode 14 is disposed on a lower surface of the semiconductor substrate 1.

In a conventional semiconductor device, when a voltage equal to or greater than a threshold voltage is applied to the gate electrode 9, a channel is formed in the body region 3 adjacent to the gate insulating film 8, and a current flows between the source electrode 11 and the drain electrode 14 via the channel. When a channel density is increased in such a semiconductor device, a power loss during energization is reduced. It is effective to reduce spacing between adjacent trenches 6 to increase the channel density. Reduction in spacing between trenches 6, however, reduces a width of a mesa between the trenches 6, making it difficult to form the source region 4 and the contact region 5.

The source region 4 and the contact region 5 are thus in the form of stripes as illustrated in FIG. 1 in Embodiment 1. According to such a configuration, even when spacing between trenches 6 is reduced, the source region 4 and the contact region 5 can easily be formed to reduce a power loss during energization.

In a configuration in which the source region 4 and the contact region 5 are in the form of stripes, however, the gate insulating film 8 and the contact region 5 are in contact with each other. The contact region 5 having a high impurity concentration is generally formed by implantation of a high dose of ions. Implantation of a high dose of ions generates many crystal defects in a region into which the ions have been implanted and a region through which the ions have passed. The crystal defects do not completely disappear while few crystal defects disappear by heating (annealing), so that many crystal defects remain in the contact region 5.

Thus, in a configuration in which the gate insulating film 8 and the contact region 5 are in contact with each other, an electric field of a gate voltage might locally be concentrated on an interface between a crystal defect portion of the contact region 5 and the gate insulating film 8, or the gate insulating film 8 might have a defect attributable to the crystal defect portion of the contact region 5. This results in a problem of a leakage current generated in the semiconductor device to reduce reliability of the semiconductor device.

In contrast, in Embodiment 1, the channel layer 7 having fewer crystal defects than the contact region 5 is disposed on the portion of the inner surface of the trench 6 corresponding at least to the contact region 5. According to such a configuration, local concentration of the electric field of the gate voltage on the interface between the crystal defect portion of the contact region 5 and the gate insulating film 8 and the defect of gate insulating film 8 attributable to the crystal defect portion can be suppressed. Reliability of the semiconductor device can thereby be increased.

In a case where the channel layer 7 has the p-type as with the body region 3, when the voltage equal to or greater than the threshold voltage is applied to the gate electrode 9, a channel is formed as in the body region 3 to form a normally-off semiconductor switching element. On the other hand, in a case where the channel layer 7 has the n-type and has a small thickness or in a case where the channel layer 7 has a low n-type impurity concentration, a depletion layer due to a pn junction between the channel layer 7 and the body region 3 extends in the channel layer 7. In the configuration in which the channel layer 7 has the n-type, a channel is formed as in the configuration in which the channel layer 7 has the p-type to form a normally-off semiconductor switching element. As described above, switching operation similar to that of the conventional semiconductor switching element can be performed when the channel layer 7 has the n-type or the p-type or does not have the conductivity type.

<Manufacturing Method>

A method of manufacturing the semiconductor device according to Embodiment 1 will be described below. First, an n-type epitaxial layer partially to be the drift layer 2 is formed on the upper surface of the n-type semiconductor substrate 1 by epitaxial growth. The body region 3, the body region 4, and the contact region 5 are then formed in an upper portion of the epitaxial layer by ion implantation. An order of ion implantation to form the body region 3, the source region 4, and the contact region 5 may be changed as appropriate.

Next, the trench 6 extending through the source region 4, the contact region 5, and the body region 3 to the drift layer 2 is formed by etching. For etching of the trench 6, an unillustrated silicon oxide film is deposited on the upper surfaces of the source region 4 and the contact region 5 and is patterned using photolithography technology and reactive ion etching. The trench 6 is formed using reactive ion etching using the patterned silicon oxide film as a mask. The trench 6 has a depth equal to or greater than a lower portion of the body region 3. After formation of the trench 6, the bottom protective region 12 is formed by ion implantation, and the connection region 13 is formed by angled ion implantation, which will be described below, for example.

After the silicon oxide film used as the mask when the trench 6 is formed is removed, the channel layer 7 as the epitaxial layer is formed on the portion of the inner surface of the trench 6 corresponding at least to the contact region 5 by epitaxial growth. In Embodiment 1, the channel layer 7 is formed to cover the entire inner surface including the side surface and the bottom surface of the trench 6 and the portion of the upper surfaces of the source region 4 and the contact region 5. When the channel layer 7 has a thickness between the contact region 5 and the gate insulating film 8 of 500 nm or less, characteristics of the semiconductor device can be improved, and a time of formation of the channel layer 7 can be reduced.

An unillustrated heat treatment apparatus is then used to perform annealing to activate impurities ion implanted in the above-mentioned step. An insulating film and a conductive member are formed on an upper surface of a configuration having been obtained so far. The gate insulating film 8 and the gate electrode 9 are formed respectively from the insulating film and the conductive member by patterning or etchback.

An insulating film covering the gate electrode 9 is formed on an upper surface of a configuration having been obtained so far, and the insulating film is patterned to form the interlayer insulating film 10 having a contact hole to expose the source region 4 and the contact region 5.

Next, the source electrode 11 electrically connected to the source region 4 and the contact region 5 is formed. As a method of forming the source electrode 11, a metal film containing Ni as a major component is first formed on the interlayer insulating film 10 and on the source region 4 and the contact region 5 in the contact hole, for example. Metal of the metal film and silicon carbide of the source region 4 and the contact region 5 are caused to react with each other by heat treatment to form the silicide film 11*a* as an ohmic electrode. An unreacted metal film remaining on the interlayer insulating film 10 and the like is then removed by wet etching. An electrode member, such as an Al alloy, is deposited on the interlayer insulating film 10 and the silicide film 11*a* to form the source electrode 11 including the silicide film 11*a*.

An electrode member, such as an Al alloy, is finally deposited on the lower surface of the semiconductor substrate 1 to form the drain electrode 14. This completes the semiconductor device according to Embodiment 1.

Summary of Embodiment 1

According to Embodiment 1 as described above, the channel layer 7 having fewer crystal defects than the contact region 5 is disposed on the portion of the inner surface of the trench 6 corresponding at least to the contact region 5. According to such a configuration, local concentration of the electric field of the gate voltage on the interface between the crystal defect portion of the contact region 5 and the gate insulating film 8 and the defect of gate insulating film 8 attributable to the crystal defect portion can be suppressed. Reliability of the semiconductor device can thereby be increased. Improvement in reliability of the semiconductor device can increase the gate voltage during on operation of the semiconductor device, and, by alleviating a vertical electric field strength of a two-dimensional gas of the channel, a channel resistance can be reduced.

In Embodiment 1, the channel layer 7 having fewer crystal defects than the body region 3 is disposed on a portion of the inner surface of the trench 6 corresponding to the contact region 5 and the body region 3. According to such a configuration, reliability of the semiconductor device can further be increased.

In Embodiment 1, the channel layer 7 covers a portion of the upper surface of the contact region 5. According to such a configuration, the leakage current can be suppressed.

Crystal defects of a silicon carbide semiconductor during heating recover less than crystal defects of silicon during heating. Thus, it is particularly effective to dispose the channel layer 7 when the body region 3 and the contact region 5 each contain silicon carbide as in Embodiment 1 because the body region 3 and the contact region 5 have more crystal defects.

Embodiment 2

In Embodiment 2, after formation of an epitaxial layer on the inner surface of the trench 6, n-type or p-type impurities are implanted into a side surface of the epitaxial layer by angled ion implantation performed one or more times to form the channel layer 7. In angled ion implantation, ion implantation is performed with the semiconductor substrate 1 being angled so that the side surface of the epitaxial layer in the trench 6 faces an ion implantation direction of an ion implantation apparatus. Angled ion implantation to form the channel layer 7 is performed on the condition that the channel layer 7 has an impurity concentration at least one order of magnitude lower than an impurity concentration of the contact region 5, so that the channel layer 7 has fewer crystal defects than the contact region 5.

Impurities may be implanted into a portion of a side surface of the channel layer 7 or different impurities may be implanted into a plurality of portions of the side surface of the channel layer 7 by patterning using photoengraving.

Figure 4:
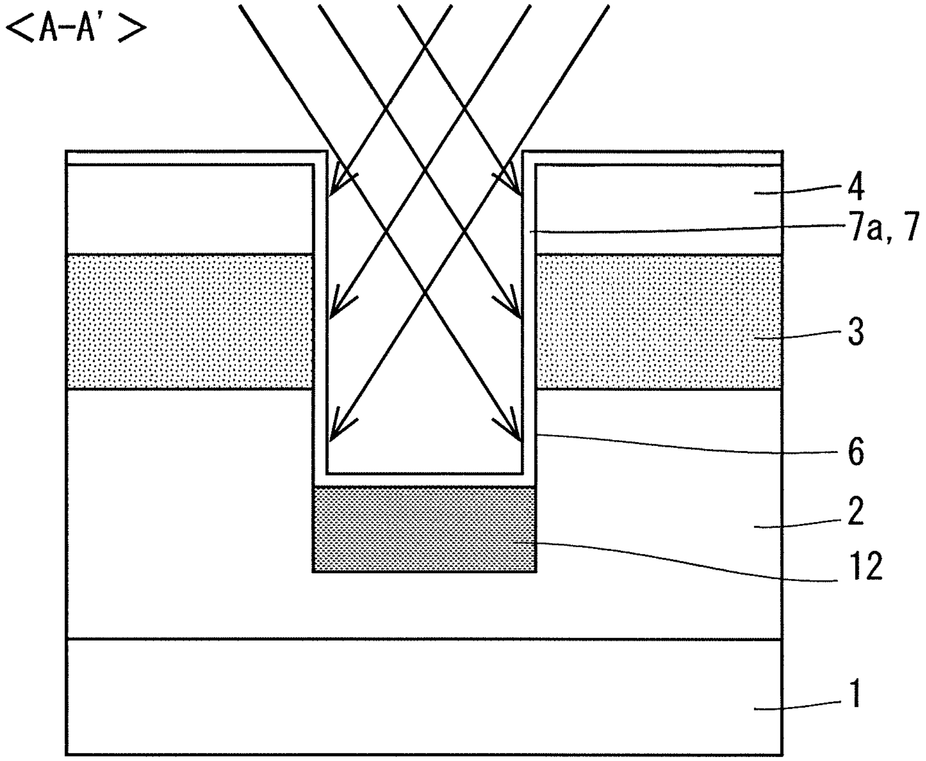
FIG. 4 is a cross-sectional view for describing a method of manufacturing a semiconductor device according to Embodiment 2.

For example, as illustrated in FIG. 4, in an A-A' cross section including the source region 4, the channel layer 7 may be formed by implanting n-type impurities into a side surface of an epitaxial layer 7*a* in the trench 6. According to such a configuration, a JFET resistance between the body region 3 and the bottom protective region 12 can be reduced.

Figure 5:
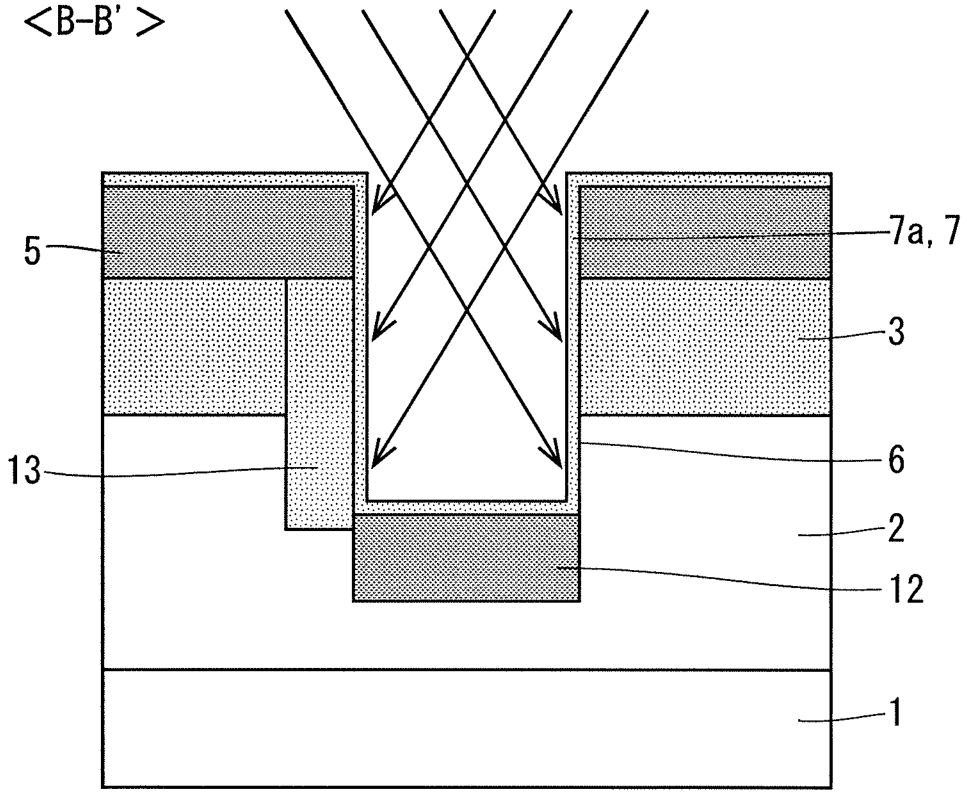
FIG. 5 is a cross-sectional view for describing the method of manufacturing the semiconductor device according to Embodiment 2.

For example, as illustrated in FIG. 5, in a B-B' cross section including the contact region 5, the channel layer 7 may be formed by implanting p-type impurities into the side surface of the epitaxial layer 7*a* in the trench 6. According to such a configuration, the body region 3 and the bottom protective region 12 are electrically connected, so that switching operation of the semiconductor device can be improved.

Furthermore, both p-type impurities and a higher dose of n-type impurities than the p-type impurities may be ion implanted to form a portion having the n-type. Similarly, both n-type impurities and a higher dose of p-type impurities than the n-type impurities may be ion implanted to form a portion having the p-type.

Summary of Embodiment 2

According to Embodiment 2 as described above, the n-type or p-type impurities are implanted into the side surface of the epitaxial layer 7*a* in the trench 6 by angled ion implantation performed one or more times to form the channel layer 7. The channel layer 7 formed by angled ion implantation can have less process variability than the channel layer 7 formed without being subjected to angled ion implantation, so that variability in threshold voltage and on resistance of the semiconductor device can be reduced. Reduction in JFET resistance, improvement in switching operation, and the like can also be expected.

Embodiment 3

In Embodiment 2, the n-type or p-type impurities are implanted into the side surface of the epitaxial layer 7*a* in the trench 6 by angled ion implantation performed one or more times to form the channel layer 7. In Embodiment 3, angled ion implantation performed one or more times is angled ion implantation performed a plurality of times at different ion implantation angles.

Figure 6:
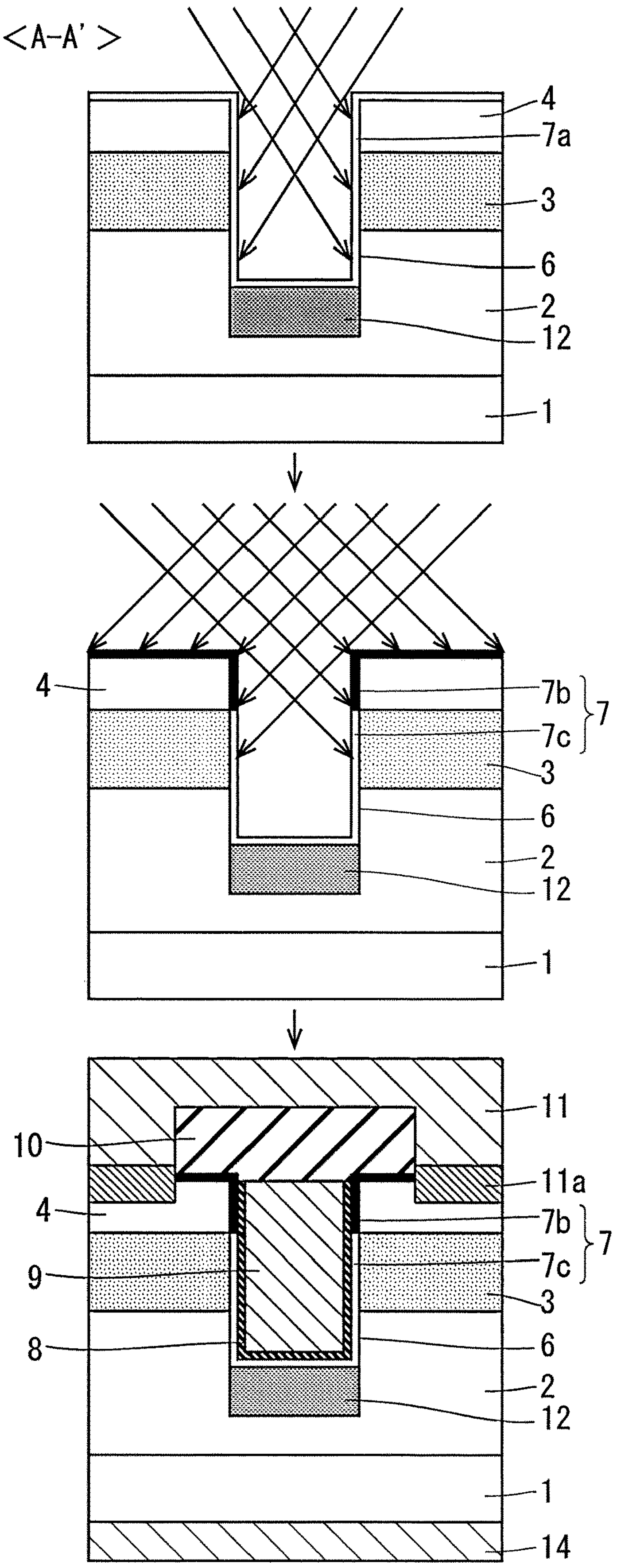
FIG. 6 is a cross-sectional view for describing a method of manufacturing a semiconductor device according to Embodiment 3.

For example, as illustrated in FIG. 6, in an A-A' cross section including the source region 4, n-type impurities having a low impurity concentration may be implanted into a portion of the side surface of the epitaxial layer 7*a* from an entrance side to a bottom side of the trench 6. N-type impurities having a high impurity concentration may be implanted into a portion 7*b* of the side surface of the epitaxial layer 7*a* on the entrance side of the trench 6 to form the channel layer 7 including the portion 7*b* and a portion 7*c*. According to such a configuration, the portion 7*b* adjacent to the source region 4 of the channel layer 7 can perform a similar function to the source region 4, so that an energization path can be widened, resulting in reduction in on resistance. A depletion layer can be formed in the portion 7*c* adjacent to the body region 3 of the channel layer 7 to form the normally-off semiconductor switching element.

Figure 7:
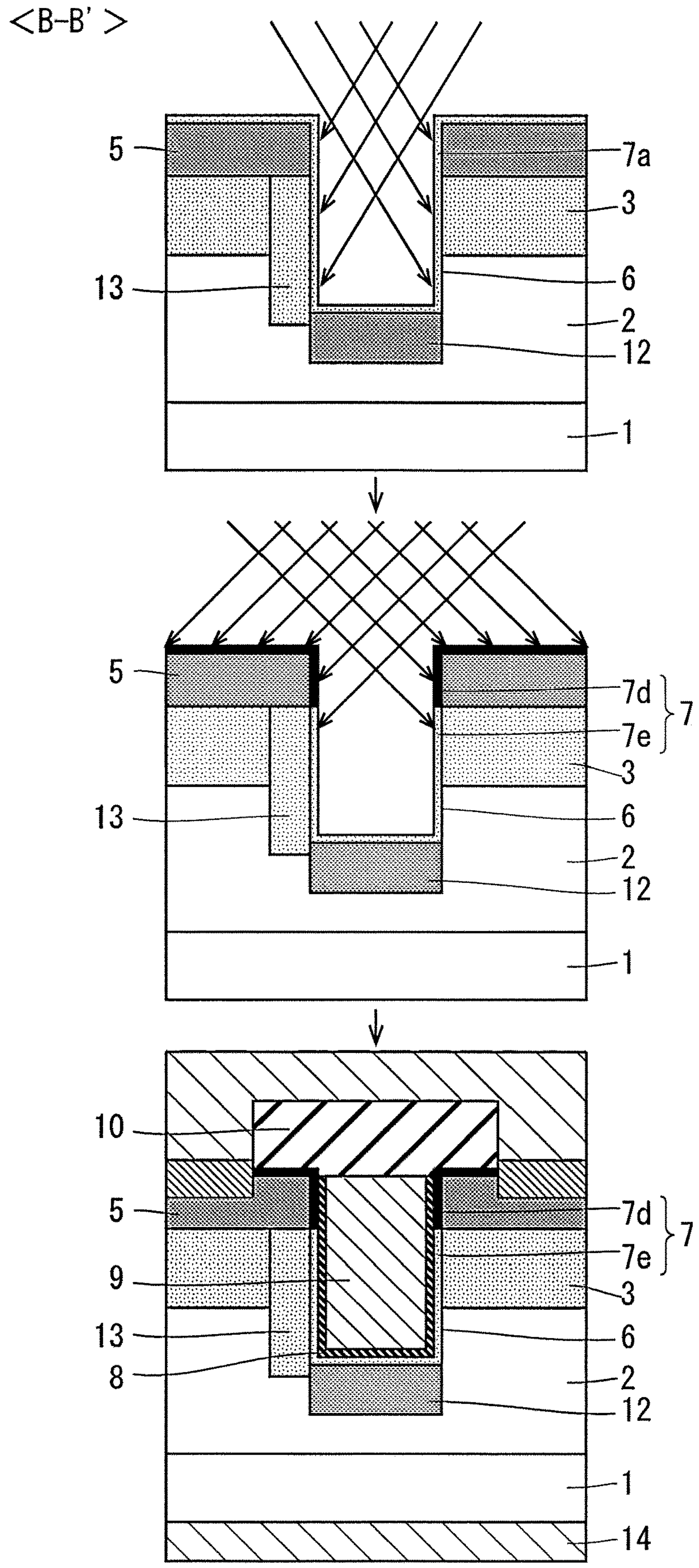
FIG. 7 is a cross-sectional view for describing the method of manufacturing the semiconductor device according to Embodiment 3.

For example, as illustrated in FIG. 7, in a B-B' cross section including the contact region 5, p-type impurities may be implanted into a portion of the side surface of the epitaxial layer 7*a* from the entrance side to the bottom side of the trench 6. N-type impurities having a high impurity concentration may be implanted into a portion 7*d* of the side surface of the epitaxial layer 7*a* on the entrance side of the trench 6 to form the channel layer 7 including the portion 7*d* and a portion 7*e*. According to such a configuration, the portion 7*d* of the channel layer 7 adjacent to the contact region 5 can perform a similar function to the source region 4, so that an energization path can be widened, resulting in reduction in the on resistance. In the portion 7*e* of the channel layer 7 adjacent to the body region 3, the body region 3 and the bottom protective region 12 are electrically connected, so that switching operation of the semiconductor device can be improved.

Summary of Embodiment 3

According to Embodiment 3 as described above, angled ion implantation performed one or more times is angled ion implantation performed a plurality of times at different ion implantation angles. According to such a configuration, a degree of freedom of design of the channel layer 7 can be increased. The portions 7*b* and 7*d* of the channel layer 7 on the entrance side of the trench 6 can perform a similar function to the source region 4, for example, so that the energization path can be widened, resulting in reduction in on resistance.

<Modifications>

The semiconductor device is the MOSFET in description made above but may be an insulated gate bipolar transistor (IGBT) or a reverse conducting-IGBT (RC-IGBT), for example. Furthermore, in the B-B' cross section including the contact region 5, when the p-type impurities are implanted to form the channel layer 7, for example, the channel layer 7 has a similar function to the connection region 13. The connection region 13 thus may not be disposed while both the channel layer 7 and the connection region 13 are disposed in Embodiments 2 and 3. When both the channel layer 7 and the connection region 13 are disposed as in Embodiments 2 and 3, the channel layer 7 and the connection region 13 may simultaneously be formed.

Embodiments and Modifications can freely be combined with each other and can be modified or omitted as appropriate.

Various aspects of the present disclosure will collectively be described below as appendices.

(Appendix 1)

A semiconductor device comprising:

a drift layer having a first conductivity type;

a source region selectively disposed above the drift layer and having the first conductivity type;

a contact region selectively disposed above the drift layer and having a second conductivity type;

a body region disposed between the drift layer and each of the source region and the contact region, having a lower second conductivity type impurity concentration than the contact region, and having the second conductivity type;

a channel layer disposed on a portion of an inner surface of a trench corresponding at least to the contact region and having fewer crystal defects than the contact region, the trench extending through the source region, the contact region, and the body region to the drift layer;

a gate insulating film disposed along the inner surface of the trench; and a gate electrode disposed on the gate insulating film in the trench.

(Appendix 2)

The semiconductor device according to Appendix 1, wherein the contact region is in the form of stripes in plan view.

(Appendix 3)

The semiconductor device according to Appendix 1 or 2, wherein the body region and the contact region each contain silicon carbide.

(Appendix 4)

The semiconductor device according to any one of Appendices 1 to 3, wherein the channel layer has a thickness between the contact region and the gate insulating film of 500 nm or less.

(Appendix 5)

The semiconductor device according to any one of Appendices 1 to 4, wherein the channel layer has the first conductivity type or the second conductivity type.

(Appendix 6)

The semiconductor device according to any one of Appendices 1 to 5, wherein the channel layer covers a portion of an upper surface of the contact region.

(Appendix 7)

A method of manufacturing a semiconductor device, the method comprising:

forming a source region, a contact region, and a body region by ion implantation, the source region being selectively disposed above a drift layer having a first conductivity type and having the first conductivity type, the contact region being selectively disposed above the drift layer and having a second conductivity type, the body region being disposed between the drift layer and each of the source region and the contact region, having a lower second conductivity type impurity concentration than the contact region, and having the second conductivity type;

forming a trench extending through the source region, the contact region, and the body region to the drift layer;

forming a channel layer having fewer crystal defects than the contact region on a portion of an inner surface of the trench corresponding at least to the contact region;

forming a gate insulating film along the inner surface of the trench; and forming a gate electrode on the gate insulating film in the trench.

(Appendix 8)

The method of manufacturing the semiconductor device according to Appendix 7, wherein forming the channel layer includes:

forming an epitaxial layer on the inner surface of the trench; and implanting impurities of the first conductivity type or the second conductivity type into a side surface of the epitaxial layer by angled ion implantation performed one or more times.

(Appendix 9)

The method of manufacturing the semiconductor device according to Appendix 8, wherein the angled ion implantation performed one or more times is angled ion implantation performed a plurality of times at different ion implantation angles.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a drift layer having a first conductivity type;

a source region selectively disposed above the drift layer and having the first conductivity type;

a contact region selectively disposed above the drift layer and having a second conductivity type;

a body region disposed between the drift layer and each of the source region and the contact region, having a lower second conductivity type impurity concentration than the contact region, and having the second conductivity type;

a channel layer disposed on a portion of an inner surface of a trench corresponding at least to the contact region and having fewer crystal defects than the contact region, the trench extending through the source region, the contact region, and the body region to the drift layer;

a gate insulating film disposed along the inner surface of the trench; and a gate electrode disposed on the gate insulating film in the trench.

2. The semiconductor device according to claim 1, wherein the contact region is in the form of stripes in plan view.

3. The semiconductor device according to claim 1, wherein the body region and the contact region each contain silicon carbide.

4. The semiconductor device according to claim 1, wherein the channel layer has a thickness between the contact region and the gate insulating film of 500 nm or less.

5. The semiconductor device according to claim 1, wherein the channel layer has the first conductivity type or the second conductivity type.

6. The semiconductor device according to claim 1, wherein the channel layer covers a portion of an upper surface of the contact region.

7. A method of manufacturing a semiconductor device, the method comprising:

forming a source region, a contact region, and a body region by ion implantation, the source region being selectively disposed above a drift layer having a first conductivity type and having the first conductivity type, the contact region being selectively disposed above the drift layer and having a second conductivity type, the body region being disposed between the drift layer and each of the source region and the contact region, having a lower second conductivity type impurity concentration than the contact region, and having the second conductivity type;

forming a trench extending through the source region, the contact region, and the body region to the drift layer;

forming a channel layer having fewer crystal defects than the contact region on a portion of an inner surface of the trench corresponding at least to the contact region;

forming a gate insulating film along the inner surface of the trench; and forming a gate electrode on the gate insulating film in the trench.

8. The method of manufacturing the semiconductor device according to claim 7, wherein forming the channel layer includes:

forming an epitaxial layer on the inner surface of the trench; and implanting impurities of the first conductivity type or the second conductivity type into a side surface of the epitaxial layer by angled ion implantation performed one or more times.

9. The method of manufacturing the semiconductor device according to claim 8, wherein the angled ion implantation performed one or more times is angled ion implantation performed a plurality of times at different ion implantation angles.

* * * * *